(12) United States Patent  
Hoshi

(10) Patent No.: US 7,408,209 B2  
(45) Date of Patent: Aug. 5, 2008

(54) SEMICONDUCTOR DEVICE WITH NOISE CONTROL

(75) Inventor: Sou Hoshi, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 11/304,212

(22) Filed: Dec. 14, 2005

(65) Prior Publication Data

US 2006/0131727 A1  Jun. 22, 2006

(30) Foreign Application Priority Data

Dec. 16, 2004 (JP) ............... 2004-364775  
Dec. 1, 2005 (JP) ............... 2005-347939

(51) Int. Cl.  
*H01L 31/112* (2006.01)

(52) U.S. Cl. ............... 257/203; 257/E31.11

(58) Field of Classification Search ............... 257/203, 257/E31.111  
See application file for complete search history.

(56) References Cited

U.S. PATENT DOCUMENTS 6,479,869 B1  11/2002  Hiraga

FOREIGN PATENT DOCUMENTS

| | | |
|---|---|---|
| JP | 1-103859 | 4/1989 |
| JP | 3040398 | 3/2000 |
| JP | 2001-102525 | 4/2000 |
| JP | 2001-110991 | 4/2001 |
| JP | 2001-127249 | 5/2001 |
| JP | 2002-246553 | 8/2002 |

*Primary Examiner*—Thao X. Le  
*Assistant Examiner*—Elias Ullah  
(74) *Attorney, Agent, or Firm*—Morgan & Finnegan, LLP

(57) ABSTRACT

Radiation noise is reduced, and any operation error is prevented by suppressing noise propagation between an input/output circuit and an internal circuit while preventing or minimizing an increase in the number of steps of semiconductor element design. A semiconductor device having an input/output circuit region and an internal circuit region includes an internal circuit power supply cell which is arranged in the input/output circuit region and supplies a power to the internal circuit region, an internal circuit ground cell which is arranged in the input/output circuit region and supplies ground to the internal circuit region, and noise control cells which are arranged to sandwich the internal circuit power supply cell and the internal circuit ground cell in the input/output circuit region and formed by electrically connecting a p-type semiconductor substrate to ground independently of the input/output circuit region and the internal circuit region.

10 Claims, 16 Drawing Sheets

F I G. 1
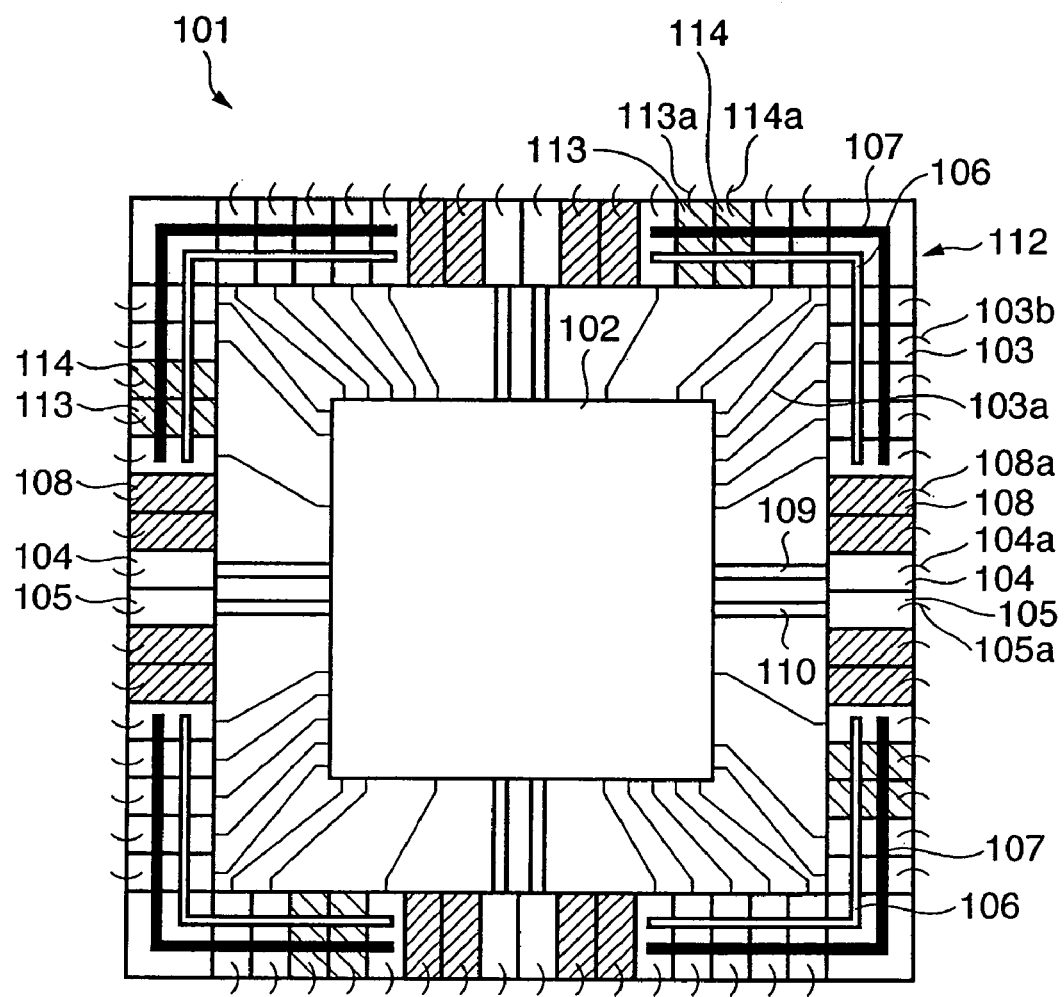

F I G. 13
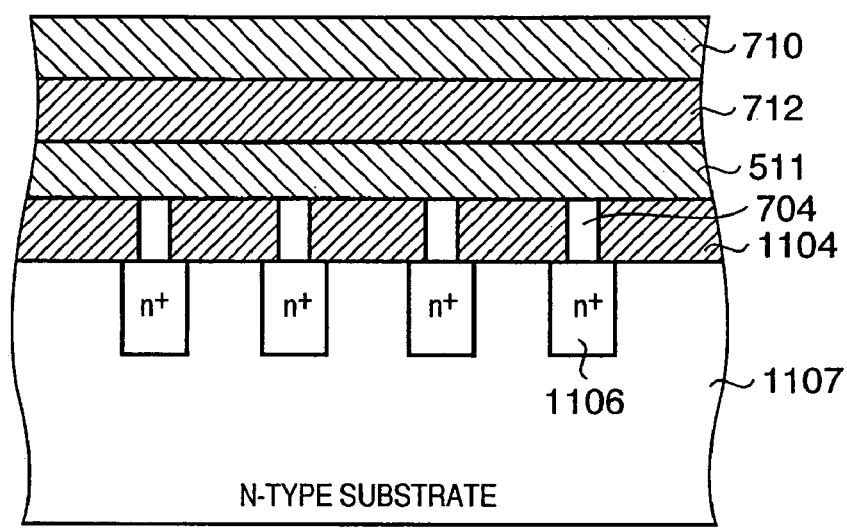

PRIOR ART

SEMICONDUCTOR DEVICE WITH NOISE CONTROL

FIELD OF THE INVENTION

The present invention relates to a noise control technique of a semiconductor device.

BACKGROUND OF THE INVENTION

A semiconductor device represented by an ASIC (Application Specific Integrated Circuit) normally has an internal circuit region and an input/output circuit region arranged around it. A circuit having a desired function such as signal processing is formed in the internal circuit region. This circuit is formed by arranging a plurality of cells using a plurality of semiconductor elements such as MOS transistors (Metal Oxide Semiconductor transistors) and connecting them by wiring.

The input/output circuit region transmits signals between the internal circuit region and a device outside the semiconductor device or supplies a power and reference potential (to be referred to as ground hereinafter) necessary for the ground in the internal circuit region and input/output circuit region to operate. The signals and power supply/ground in the input/output circuit region and the internal circuit region are connected by wiring.

Like the internal circuit region, the input/output circuit region is also formed by arranging a plurality of cells for input/output circuits, in which a plurality of semiconductor elements such as transistors are arranged. The semiconductor device and an external device are connected through pads or semiconductor packages in the input/output cells. Power supply/ground wiring to supply a power supply/ground to the semiconductor elements in the internal circuit region and input/output circuit region is present in the semiconductor device independently of the signal wiring. To stabilize the potential immediately under the channel of a MOS transistor, the power supply/ground wiring connects the semiconductor substrate to the power supply wiring in a p-type MOS (to be referred to as a PMOS hereinafter) or connects the semiconductor substrate to the ground wiring in an n-type MOS (to be referred to as an NMOS hereinafter).

In the above-described structure, a noise current which is generated in the power supply/ground wiring in the semiconductor device when it operates poses a problem. A noise current generated by the operation of a circuit flows through the power supply/ground wiring and is injected from the connection portion between the semiconductor substrate and the power supply/ground wiring to the semiconductor substrate. As a result, the potential immediately under the channel of the MOS transistor varies and causes an operation error.

A technique is conventionally known in which a guard ring absorbs noise to prevent any operation error caused by noise propagation in the semiconductor substrate or any operation error or breakdown by latch-up.

In Japanese Patent Laid-Open Nos. 2002-246553, 2001-102525, and 1-103859, a guard ring surrounds the internal circuit serving as a noise source to prevent power supply/ground noise from propagating to another circuit through the semiconductor substrate and causing an operation error.

In Japanese Patent No. 3403981 and Japanese Patent Laid-Open No. 2001-127249, a thyristor or diode structure is intentionally inserted in a guard ring structure to increase the electrostatic destruction preventing effect.

Another problem of noise is radiation noise which is generated when the noise current of the power supply/ground in the internal circuit region propagates to the input/output circuit region through the power supply/ground wiring, and the power supply/ground noise of the internal circuit is superimposed on a signal of an input/output circuit, which is to be output to the outside. Conventionally, placing focus on the fact that the internal circuit and the power supply/ground of the input/output circuits are connected by wiring, the internal circuit and the power supply/ground of the input/output circuits are disconnected to avoid noise propagation from the internal circuit to the input/output circuits.

In the above-described prior arts, noise propagation through some internal circuits, some internal circuit wiring, and the semiconductor substrate or noise propagation through the wiring from the internal circuit to the input/output circuits is prevented. However, there is no measure against noise propagation through the semiconductor substrate between the internal circuit and the input/output circuits at all. Hence, the prior arts cannot prevent an operation error caused by propagation of noise, represented by SSN (Simultaneous Switching Noise) of the input/output circuits, which is generated by the input/output circuit operation to the internal circuit through the semiconductor substrate, or an increase in radiation noise caused by noise propagation from the internal circuit to the input/output circuits through the semiconductor substrate.

SUMMARY OF THE INVENTION

The present invention has been made in consideration of the above-described problems, and has as its object to reduce radiation noise and prevent any operation error by suppressing noise propagation between an input/output circuit and an internal circuit while preventing or minimizing an increase in the number of steps of semiconductor element design.

In order to solve the above-described problems and achieve the object, according to a first aspect of the present invention, there is provided a semiconductor device having an input/output circuit region and an internal circuit region, comprising an internal circuit power supply cell which is arranged in the input/output circuit region and supplies a power to the internal circuit region, an internal circuit ground cell which is arranged in the input/output circuit region and supplies ground to the internal circuit region, and noise control cells which are arranged to sandwich the internal circuit power supply cell and the internal circuit ground cell in the input/output circuit region and formed by electrically connecting a p-type semiconductor substrate to ground independently of the input/output circuit region and the internal circuit region.

According to a second aspect of the present invention, there is provided a semiconductor device having an input/output circuit region and an internal circuit region, comprising an internal circuit power supply cell which is arranged in the input/output circuit region and supplies a power to the internal circuit region, an internal circuit ground cell which is arranged in the input/output circuit region and supplies ground to the internal circuit region, and noise control cells which are arranged to sandwich the internal circuit power supply cell and the internal circuit ground cell in the input/output circuit region and formed by electrically connecting an n-type semiconductor substrate to a power supply independently of the input/output circuit region and the internal circuit region.

According to the present invention, radiation noise can be reduced, and any operation error can be prevented by suppressing noise propagation between an input/output circuit and an internal circuit while preventing or minimizing an increase in labor of semiconductor element design.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 1 is a view showing the schematic structure of a semiconductor device according to the first embodiment of the present invention;

FIG. 13 is a sectional view showing the sectional structure of an input/output cell using an n-type substrate, which is used in the second embodiment;

DETAILED DESCRIPTION OF THE PREFERRED EMBODIMENTS

Preferred embodiments of the present invention will be described below in detail with reference to the accompanying drawings.

First Embodiment

Figure 2:
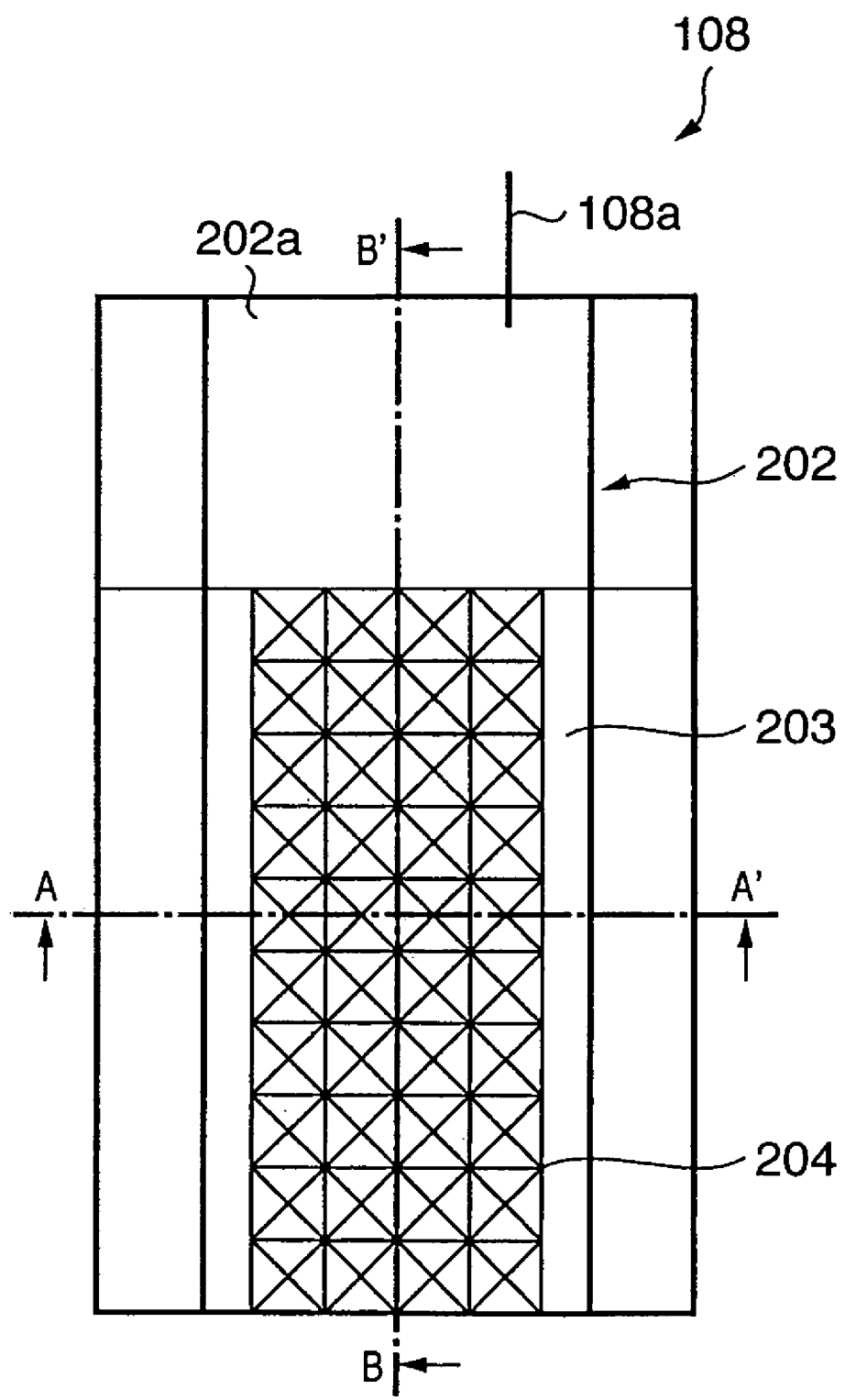
FIG. 2 is a plan view showing the structure of a noise control cell used in the first embodiment.
Figure 3:
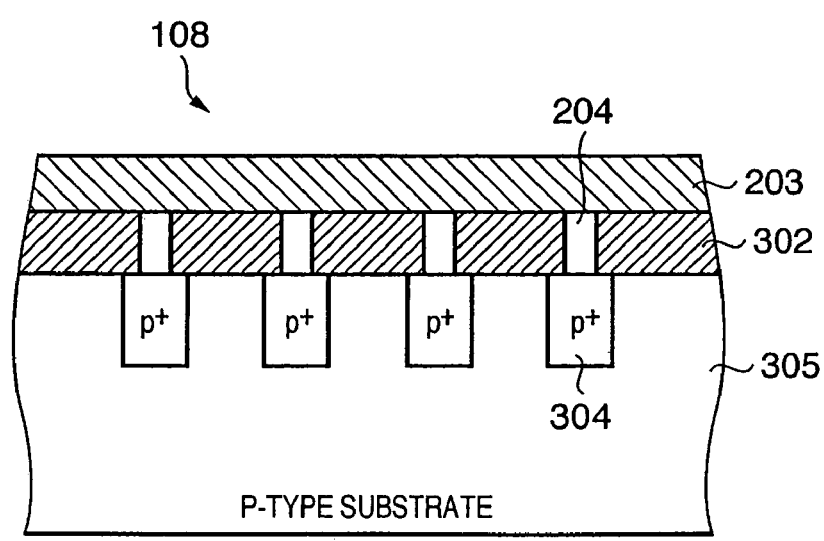
FIG. 3 is a sectional view showing the sectional structure of a noise control cell using a p-type substrate, which is used in the first embodiment.
Figure 4:
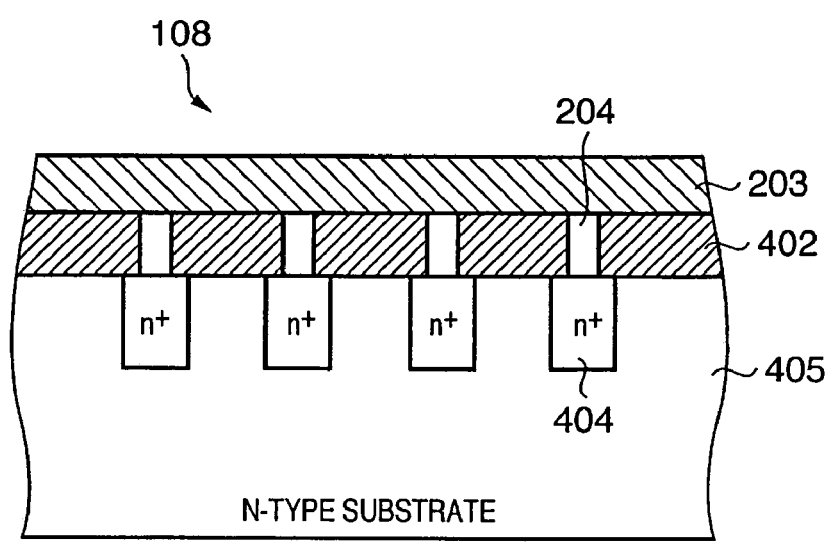
FIG. 4 is a sectional view showing the sectional structure of a noise control cell using an n-type substrate, which is used in the first embodiment.
Figure 5:
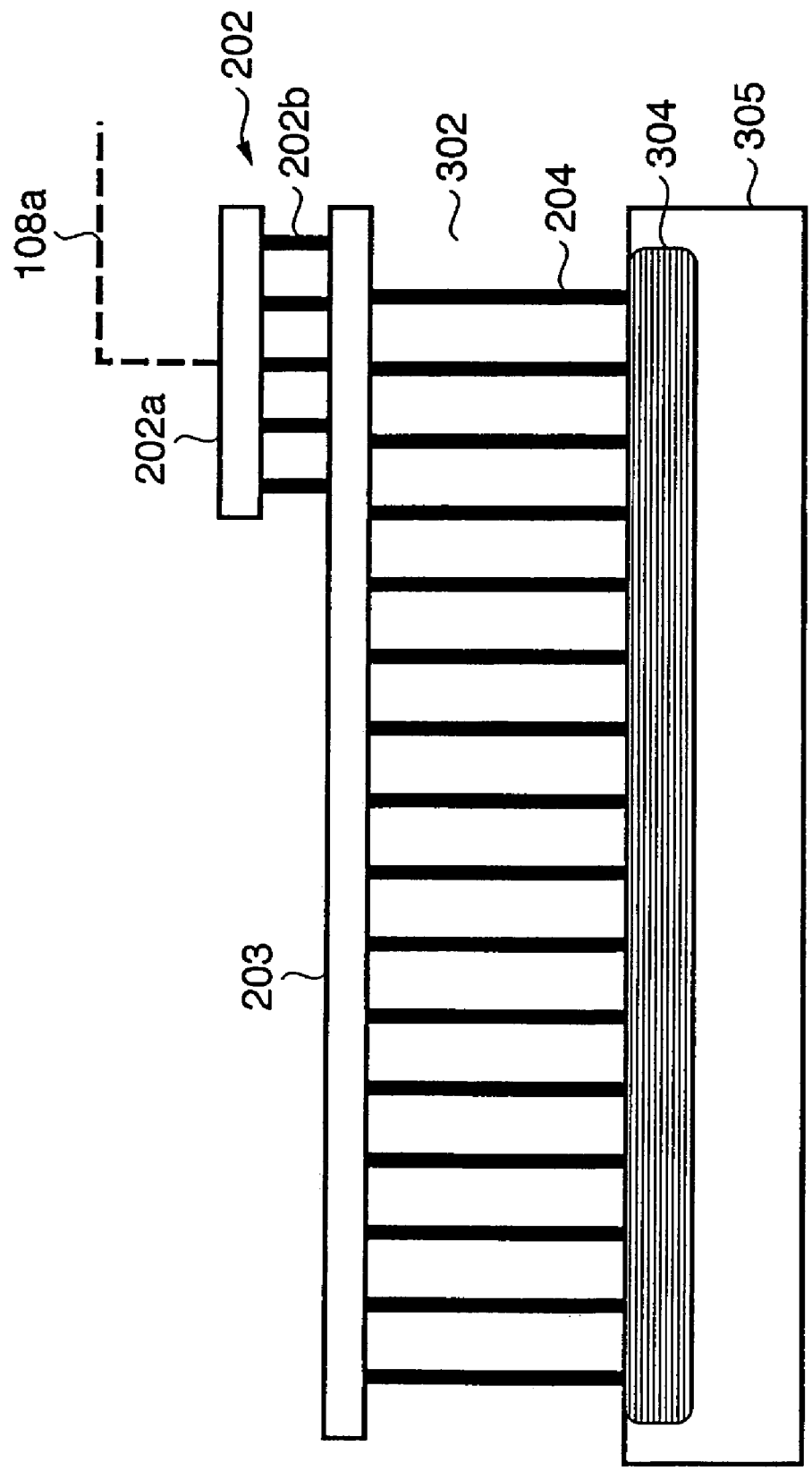
FIG. 5 is a sectional view taken along a line B-B' in FIG. 2.

FIGS. 1, 2, 3, and 4 are views showing the first embodiment of the present invention. FIG. 1 is a view showing the outline of the layout of a semiconductor device according to the first embodiment. FIG. 1 corresponds to FIG. 16 which shows a prior art (to be described later). FIG. 2 shows the structure of a noise control cell 108 as a principal part of the first embodiment. FIGS. 3 and 4 are sectional views taken along a line A-A' in FIG. 2. FIG. 5 is a sectional view of the noise control cell 108 taken along a line B-B'.

Referring to FIG. 1, a semiconductor device 101 comprises an internal circuit 102 and input/output circuit region 112. The input/output circuit region 112 comprises input/output cells (I/O cells) 103 which transmit signals between the internal circuit 102 and a device outside the semiconductor device 101, power supply wiring 107 and ground wiring 106 to supply a power and ground to the input/output cells 103, input/output circuit power supply cells 113 to connect the power supply wiring 107 to an input/output circuit power supply outside the semiconductor device 101 through wiring 113a, input/output circuit ground cells 114 to connect the ground wiring 106 to an input/output circuit ground outside the semiconductor device 101 through wiring 114a, the noise control cells 108 to absorb a noise signal injected from the internal circuit 102 to the semiconductor substrate, internal circuit power supply cells 104 to supply a power to the internal circuit 102, and internal circuit ground cells 105 to supply ground to the internal circuit 102.

The internal circuit power supply cell 104 is connected to the internal circuit 102 by an internal circuit power supply wiring 109. The internal circuit ground cell 105 is connected to the internal circuit 102 by an internal circuit ground wiring 110. The internal circuit power supply cell 104 is also connected to the internal circuit power supply outside the semiconductor device 101 by wiring 104a. The internal circuit ground cell 105 is also connected to internal circuit ground outside the semiconductor device 101 by wiring 105a.

The input/output cell 103 is connected to the internal circuit 102 by signal wiring 103a and also connected to a signal line outside the semiconductor device 101 by signal wiring 103b. The noise control cell 108 is connected to ground or power supply outside the semiconductor device 101 by wiring 108a.

Figure 16:
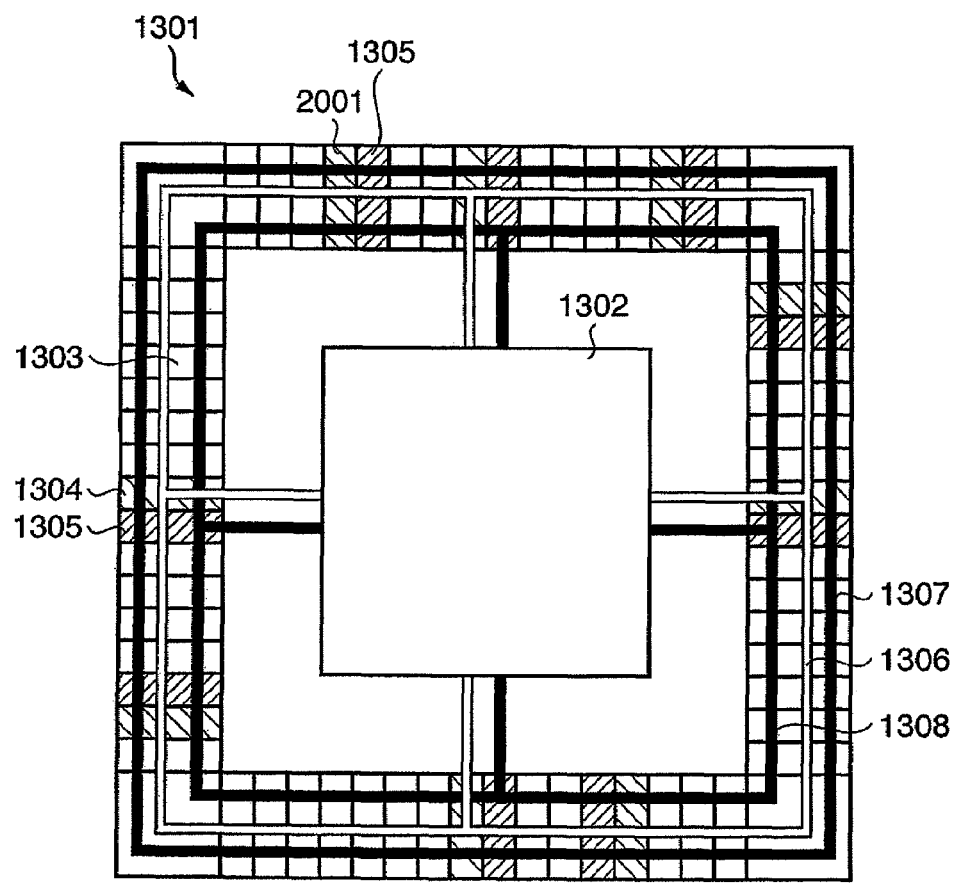
FIG. 16 is a view showing the schematic structure of a conventional semiconductor device.

Conventionally, as shown in FIG. 16, input/output circuit power supply wiring 1307, internal circuit power supply wiring 1308, and ground ring wiring 1306 are formed in an input/output circuit region 1312 of a semiconductor device 1301.

This is because the input/output circuit power supply wiring, the internal circuit power supply wiring, and the ground wiring are present in signal cells 1303, internal circuit power supply cells 1304, input/output circuit power supply cells 2001 and ground cells 1305. When the input/output cells are arranged at the time of layout, the ring wiring is automatically formed.

The first difference between the prior art and the semiconductor device 101 of the first embodiment is that the power supply wiring 109 and ground wiring 110 for the internal circuit 102 and the power supply wiring 107 and ground wiring 106 for the input/output circuits are divided in the input/output circuit region 112. The power and ground are supplied from the outside of the semiconductor device 101 to the internal circuit 102 from only the internal circuit power supply cells 104 and ground cells 105. The second difference is that the noise control cells 108 are arranged on both sides of the internal circuit power supply cell 104 and ground cell 105.

No input/output circuit power supply wiring, internal circuit power supply wiring, and ground ring wiring are present in the noise control cell 108 of this embodiment. For this reason, when the noise control cells 108 are arranged on both sides of the internal circuit power supply cell 104 and ground cell 105, as shown in FIG. 1, the supply wiring 109 and internal circuit ground wiring 110 for the internal circuit and the power supply wiring 107 and ground ring wiring 106 for the input/output circuits can be divided.

FIG. 2 is an enlarged plan view of the noise control cell 108. FIGS. 3 and 4 are sectional views taken along the line A-A' in FIG. 2. FIG. 5 is a sectional view taken along the line B-B'.

As shown in FIGS. 1 and 3, when the semiconductor device 101 is formed on the basis of a p-type substrate 305, the p-type substrate 305 of the noise control cell 108 is connected to external ground by the wiring 108a independently of the input/output circuit ground wiring 114a and internal circuit ground wiring 105a. Connection to the external ground is done through the wiring 108a connected to a pad 202a in a region 202 shown in FIG. 2. As shown in FIGS. 2 and 5, the pad 202a is connected to wiring 203 through vias 202b. The wiring 203 is connected to the semiconductor substrate 305 through vias 204. As shown in FIGS. 3 and 5, the vias 204 are connected to the p-type substrate 305 through $p^+$-regions 304.

FIG. 4 shows the semiconductor device 101 which is formed on the basis of an n-type substrate 405. The basic structure is the same as the device using the p-type substrate. The pad 202a is connected to the wiring 203. The wiring 203 is connected to the semiconductor substrate 405 through the vias 204. The vias 204 are connected to the n-type substrate 405 through $n^+$-regions. In the p-type substrate, the pad 202a of the noise control cell is connected to the external ground through the wiring 108a. In the n-type substrate, however, the pad 202a of the noise control cell is connected to an external power supply through the wiring 108a. Referring to FIGS. 3 to 5, reference numerals 302 and 402 denote Interlayer Insulating films.

When the noise control cell 108 is used, first, power supply noise and ground noise generated by the internal circuit operation can be prevented from propagating to the input/output circuit region 112 through the wiring. Noise superimposition on the signal output of the semiconductor device can be prevented. Radiation noise by noise superimposed on the output signal of the semiconductor device can be reduced. These effects can be realized by automatically dividing the ring wiring by arranging the noise control cells 108.

The noise control cell 108 can be considered to be equivalent to the normal input/output cell 103 in semiconductor layout. Hence, noise control can be realized without any influence on the conventional semiconductor layout method or layout labor. Power supply noise and ground noise generated by the internal circuit operation, which are injected from the internal circuit power supply cell 104 to the ground cell 105, are absorbed as they propagate from the semiconductor substrate 305 or 405 in the noise control cell 108 through the vias 204 and then released from the noise control wiring 203 to the outside of the semiconductor device through the vias 202b, pad 202a, wiring 108a, and semiconductor package. That is, noise propagation to the input/output circuit region not only through the wiring but also through the semiconductor substrate can be prevented. Hence, the effect of reducing radiation noise caused by noise superimposed on the signal output of the semiconductor device can further be increased.

Second Embodiment

FIGS. 6 to 13 show the second embodiment. The same reference numerals as in the first embodiment denote the same functional parts in the second embodiment, and a description thereof will be omitted.

The difference from the first embodiment is that extended noise control wiring 511 independently of input/output circuit power supply wiring 107 and ground wiring 106 and internal circuit power supply wiring 109 and ground wiring 110 are present in an input/output circuit region 512, the extended noise control wiring 511 automatically connect noise control cells 508 when normal input/output cells 503 and the noise control cells 508 are arranged, and the extended noise control wiring 511 are connected to the semiconductor substrate through contact vias. The noise control cell 508 has almost the same function as the noise control cell 108 of the first embodiment.

In the first embodiment, power supply noise and ground noise generated by the internal circuit operation are absorbed through the semiconductor substrate by only the noise control cells 108 arranged on both sides of the internal circuit power supply cell 104 and ground cell 105.

In the second embodiment, however, the noise control cells 508 are connected by the extended noise control wiring 511. In addition, the extended noise control wiring 511 are connected to the semiconductor substrate immediately under them through vias. Of noise which is injected to the semiconductor substrate in an internal circuit region 102 and propagates in a wide range, noise propagating to the input/output circuit region 512 can be absorbed by the extended noise control wiring 511. Hence, the noise reduction effect of the first embodiment can be increased.

Furthermore, when the extended noise control wiring 511 is connected to the semiconductor substrate immediately under them, power supply noise and ground noise generated by the operation of the input/output circuits propagate through the extended noise control wiring 511 and are absorbed by the noise control cells 508. That is, any operation error of the internal circuit is prevented by causing the extended noise control wiring 511 and noise control cells 508 to prevent noise propagation between the input/output circuit region 512 and the internal circuit 102. Additionally, since the extended noise control wiring 511 and the connection portions (vias) between the extended noise control wiring 511 and the semiconductor substrate are included in the input/output cells 503 and noise control cells 508, noise control can be realized without any influence on the conventional semiconductor layout method or layout labor, as in the first embodiment.

Figure 7:
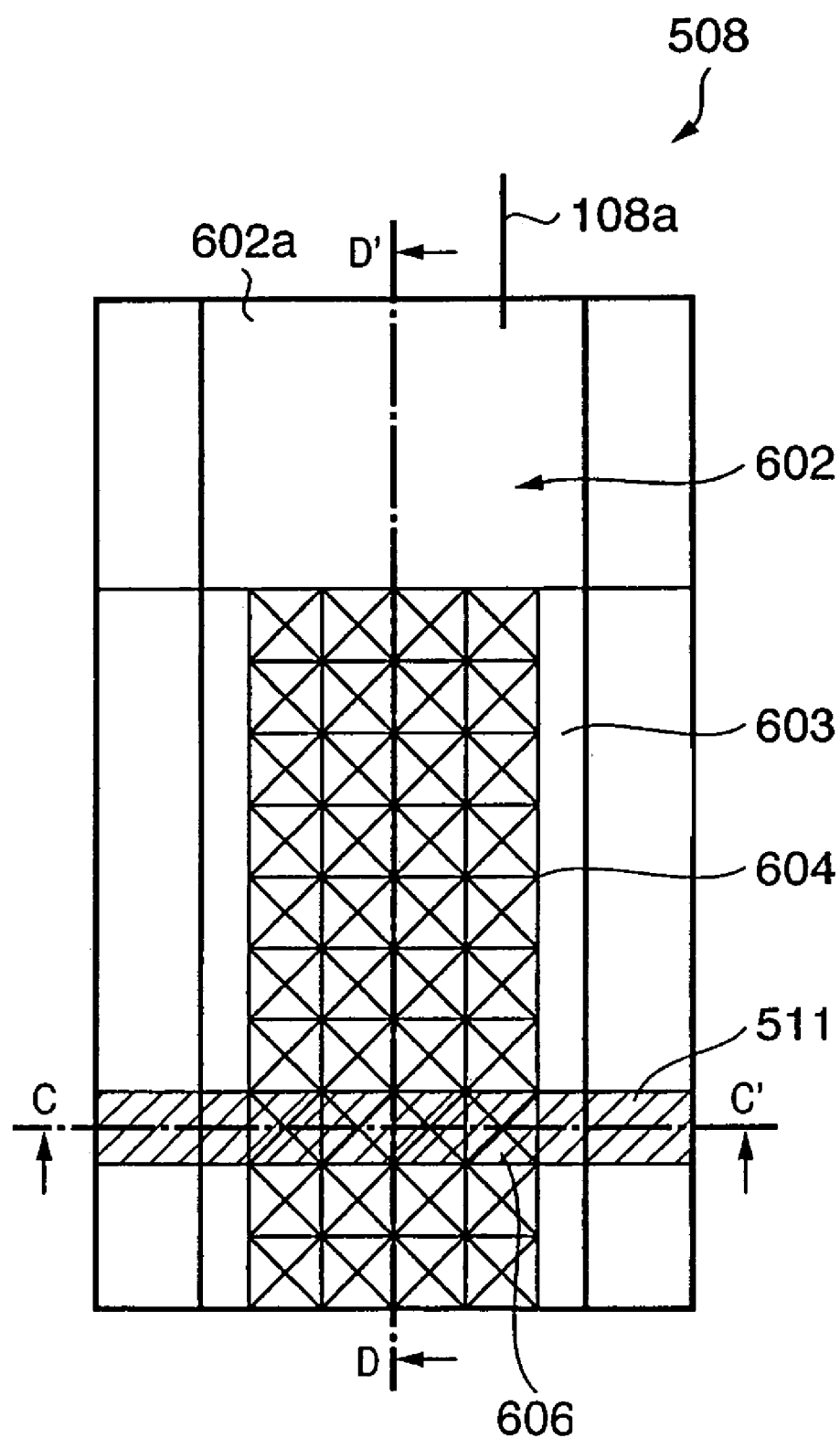
FIG. 7 is a plan view showing the structure of a noise control cell used in the second embodiment.
Figure 8:
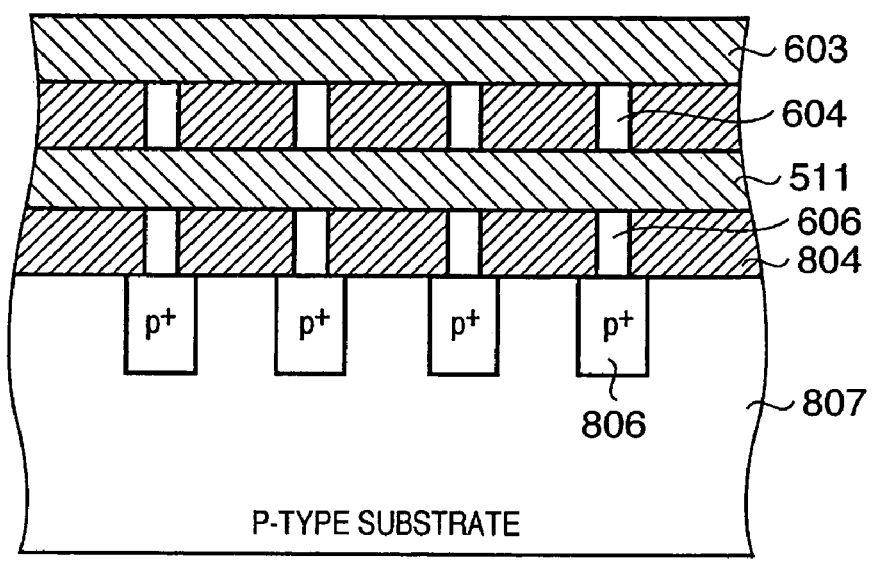
FIG. 8 is a sectional view showing the sectional structure of a noise control cell using a p-type substrate, which is used in the second embodiment.
Figure 9:
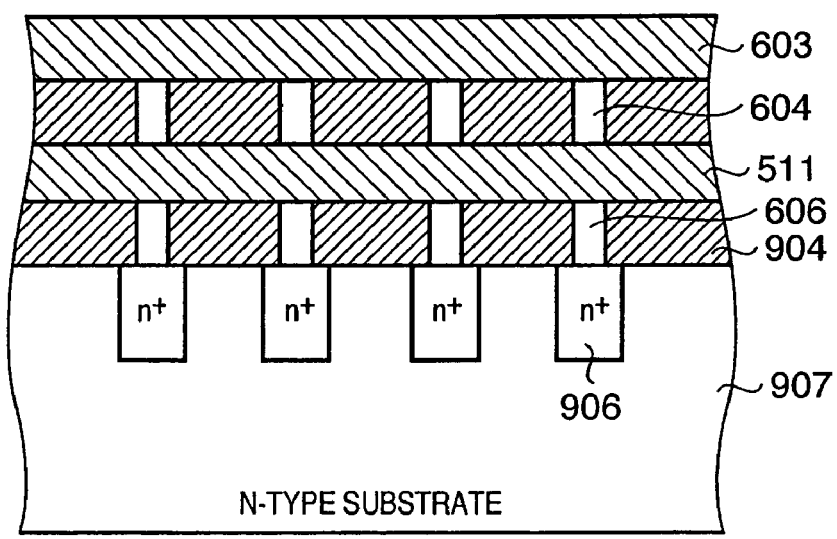
FIG. 9 is a sectional view showing the sectional structure of a noise control cell using an n-type substrate, which is used in the second embodiment.
Figure 10:
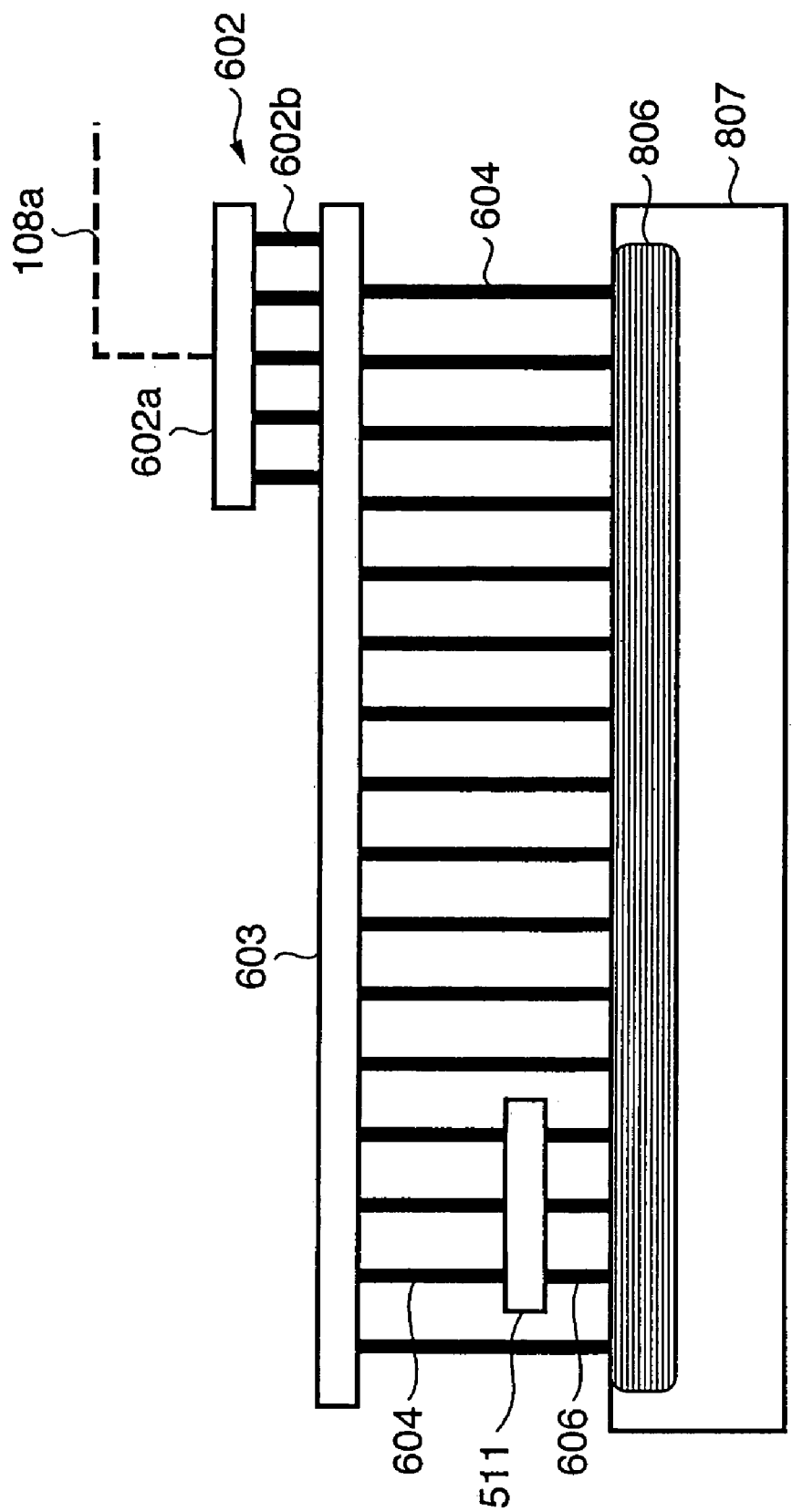
FIG. 10 is a sectional view taken along a line D-D' in FIG. 7.
Figure 11:
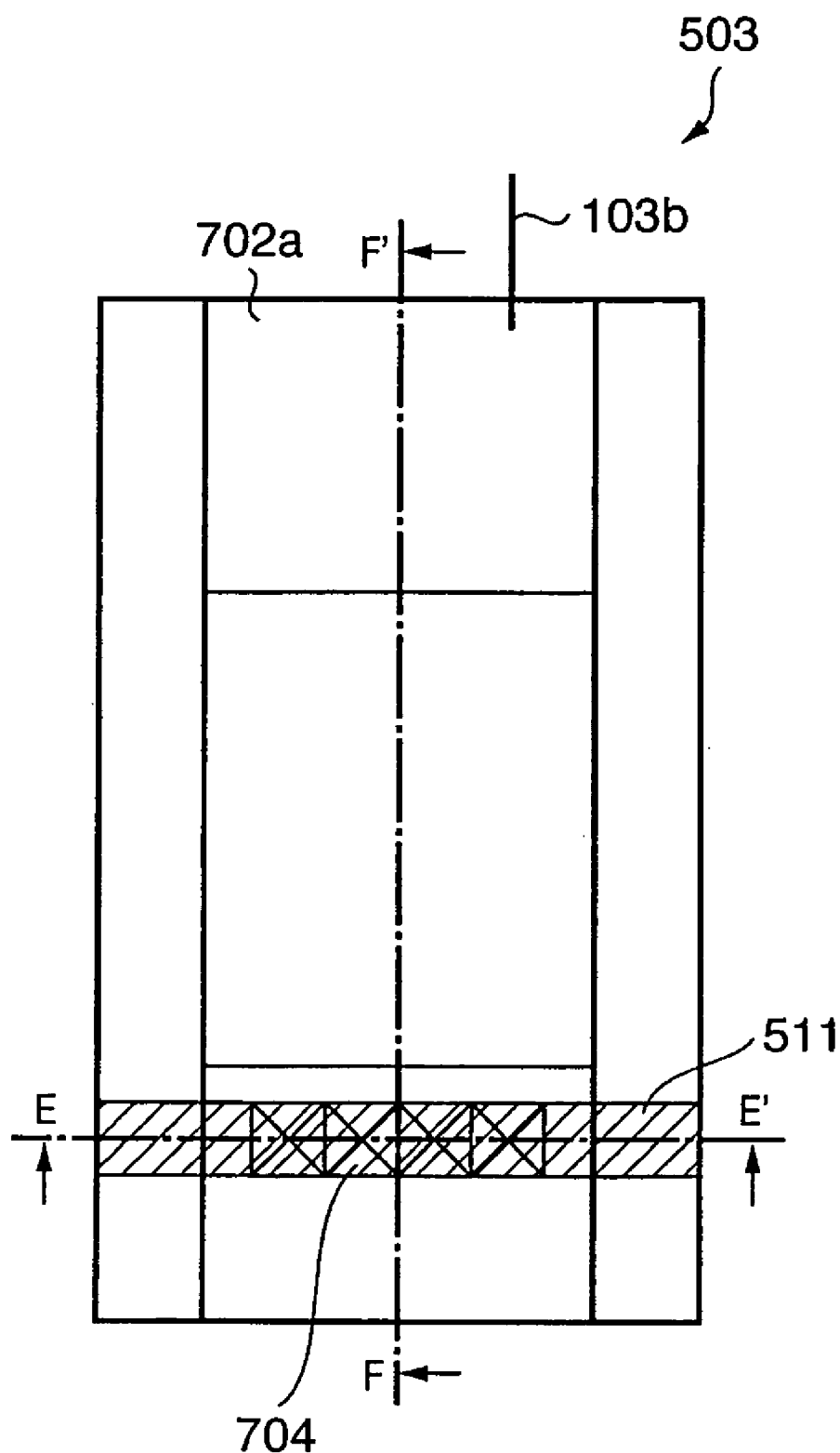
FIG. 11 is a plan view showing the structure of an input/output cell used in the second embodiment.
Figure 12:
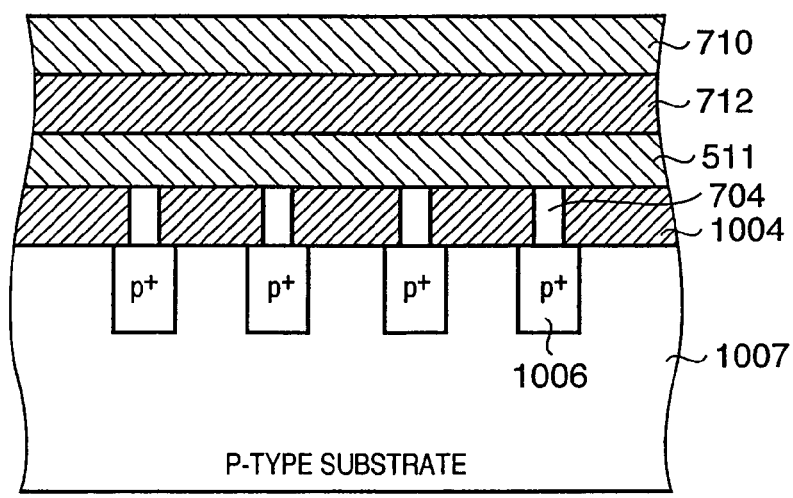
FIG. 12 is a sectional view showing the sectional structure of an input/output cell using a p-type substrate, which is used in the second embodiment.
Figure 14:
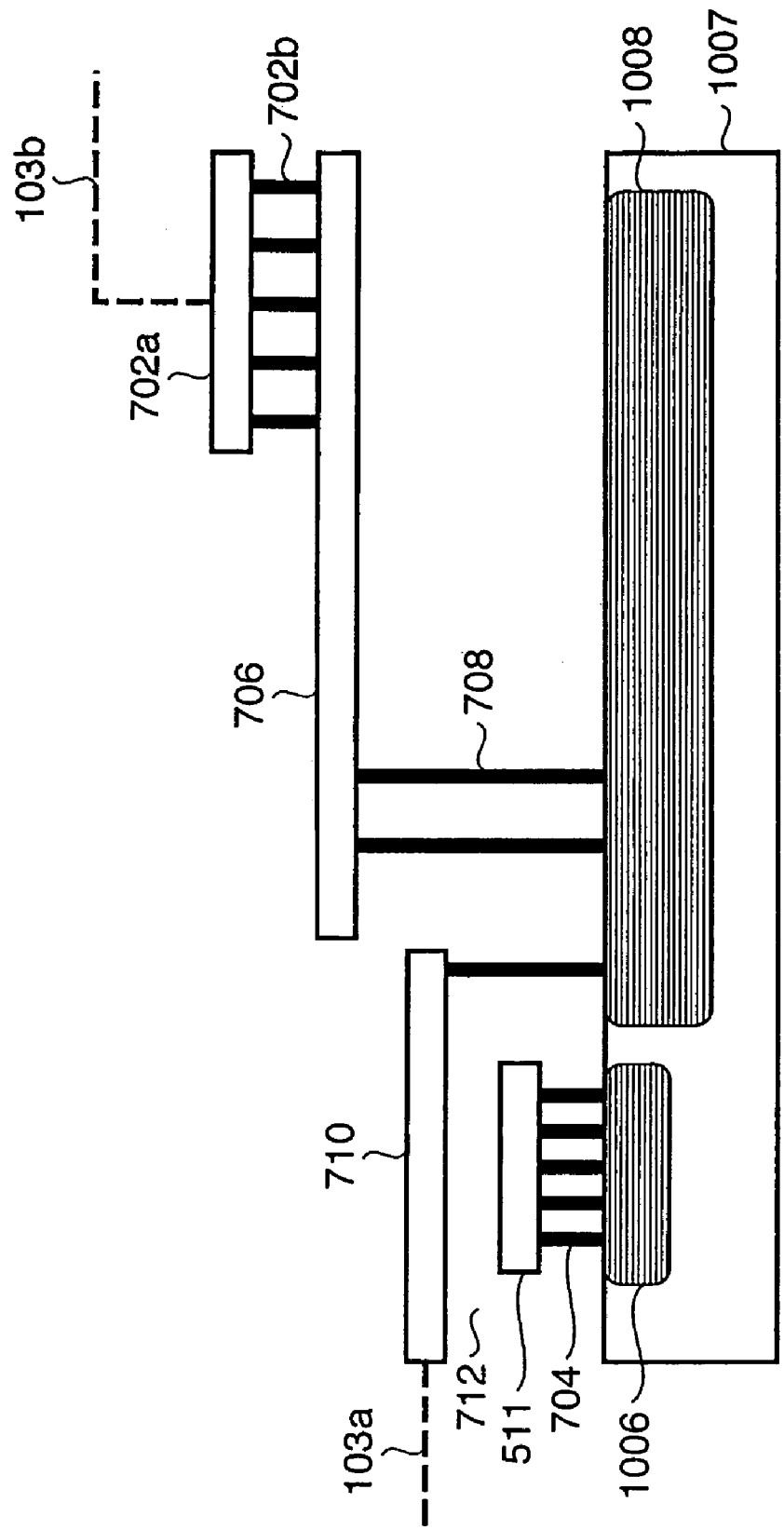
FIG. 14 is a sectional view taken along a line F-F' in FIG. 11.

FIG. 7 is a schematic view of the noise control cell 508 according to the second embodiment. FIGS. 8 and 9 show a section taken along a line C-C' in FIG. 7. FIG. 10 is a sectional view taken along a line D-D' in FIG. 7. FIG. 11 is a schematic view of the input/output cell 503 except the noise control cell. FIGS. 12 and 13 show a section taken along a line E-E' in FIG. 11. FIG. 14 is a sectional view taken along a line F-F' in FIG. 11.

A case wherein a semiconductor device 501 is of p-type will be described with reference to FIGS. 7, 8, and 10. A p-type substrate 807 of the noise control cell 508 is connected to external ground independently of input/output circuit ground wiring 114a and internal circuit ground wiring 105a. Connection to the external ground is done through a pad 602a present in a region 602 and the wiring 108a, like the normal input/output cell. The pad 602a is connected to wiring 603 through vias 602b. The wiring 603 is connected to the semiconductor substrate 807 through vias 604. The extended noise control wiring 511 is connected to the wiring 603 through the vias 604 and to the semiconductor substrate 807 through vias 606.

As shown in FIGS. 8 and 10, the vias 604 and 606 are connected to the p-type substrate 807 through $p^+$-regions 806. Even when the semiconductor device 501 is formed on the basis of an n-type substrate 907, as shown in FIG. 9, the basic structure is the same as the device using the p-type substrate.

The pad 602a is connected to the wiring 603 through the vias 602b. The wiring 603 is connected to the semiconductor substrate through the vias 604. The extended noise control wiring 511 is connected to the wiring 603 through the vias 604 and to the semiconductor substrate 907 through vias 606. The vias 604 and 606 are connected to the n-type substrate 907 through $n^+$-regions 906. In the p-type substrate, the pad 602a of the noise control cell 508 is connected to the external ground through the wiring 108a. In the n-type substrate, however, the pad 602a of the noise control cell 508 is connected to an external power supply through the wiring 108a. Referring to FIGS. 8 to 9, reference numerals 804 and 904 denote Interlayer Insulating films.

A case wherein the semiconductor device 501 is of p-type will be described next with reference to FIGS. 11 and 12. FIG. 11 is a schematic view of the input/output cell 503 except the noise control cell.

Figure 6:
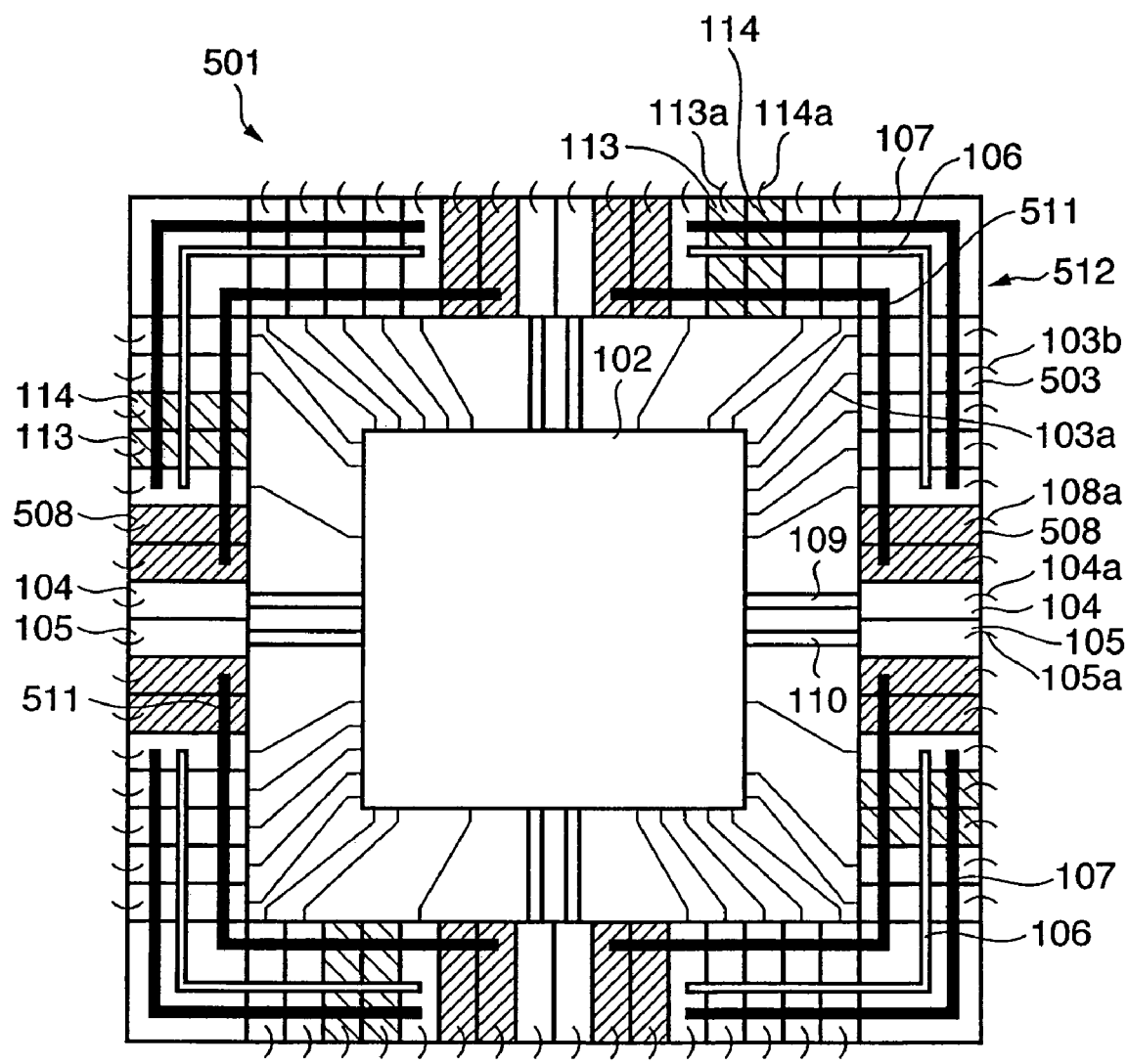
FIG. 6 is a view showing the schematic structure of a semiconductor device according to the second embodiment of the present invention.

Unlike the conventional input/output cell, a connection via 704 to the extended noise control wiring 511 and semiconductor substrate 1007 is included in the input/output cell 503 such that the noise control cells 508 can be connected by the extended noise control wiring 511, and the extended noise control wiring 511 between the noise control cells 508 can electrically be connected to a semiconductor substrate 1007. When the noise control cells 508 and the input/output cells 503 except the noise control cells are arranged in the input/output circuit region 512, as shown in FIG. 6, the extended noise control wiring 511 of each input/output cell 503 is connected to the extended noise control wiring 511 of an adjacent input/output cell 503. Hence, the noise control cells 508 are automatically connected by the extended noise control wiring 511, and the extended noise control wiring 511 is connected to the semiconductor substrate 1007 through the connection vias 704.

Connection between the semiconductor substrate 1007 and the extended noise control wiring 511 of each input/output cell 503 will be described with reference to FIGS. 11, 12, 13, and 14. FIGS. 12 and 13 are sectional views taken along a line E-E' in FIG. 11. FIG. 14 is a sectional view taken along a line F-F' in FIG. 11.

Referring to FIG. 12 which shows the section taken along the line E-E' in FIG. 11, the vias 704 are connected to the p-type substrate 1007 through $p^+$-regions 1006. Even when the semiconductor device 501 is formed on the basis of an n-type substrate 1107, as shown in FIG. 13, the basic structure is the same as the device using the p-type substrate. The vias 704 are connected to the n-type substrate 1107 through $n^+$-type regions 1106. Referring to FIGS. 12 and 13, reference numeral 710 denotes connection wiring to the internal circuit 102; and 712, 1004, and 1104, Interlayer Insulating films. Referring to FIG. 14, reference numeral 702a denotes a connection pad to output a signal to the outside of the semiconductor device; 706, leading wiring from the connection pad 702a; 702b, a via to connect the connection pad 702a to the leading wiring 706; 1008, an input/output circuit formation region; and 708, a via to connect the leading wiring 706 to the input/output circuit formation region 1008.

Third Embodiment

Figure 15:
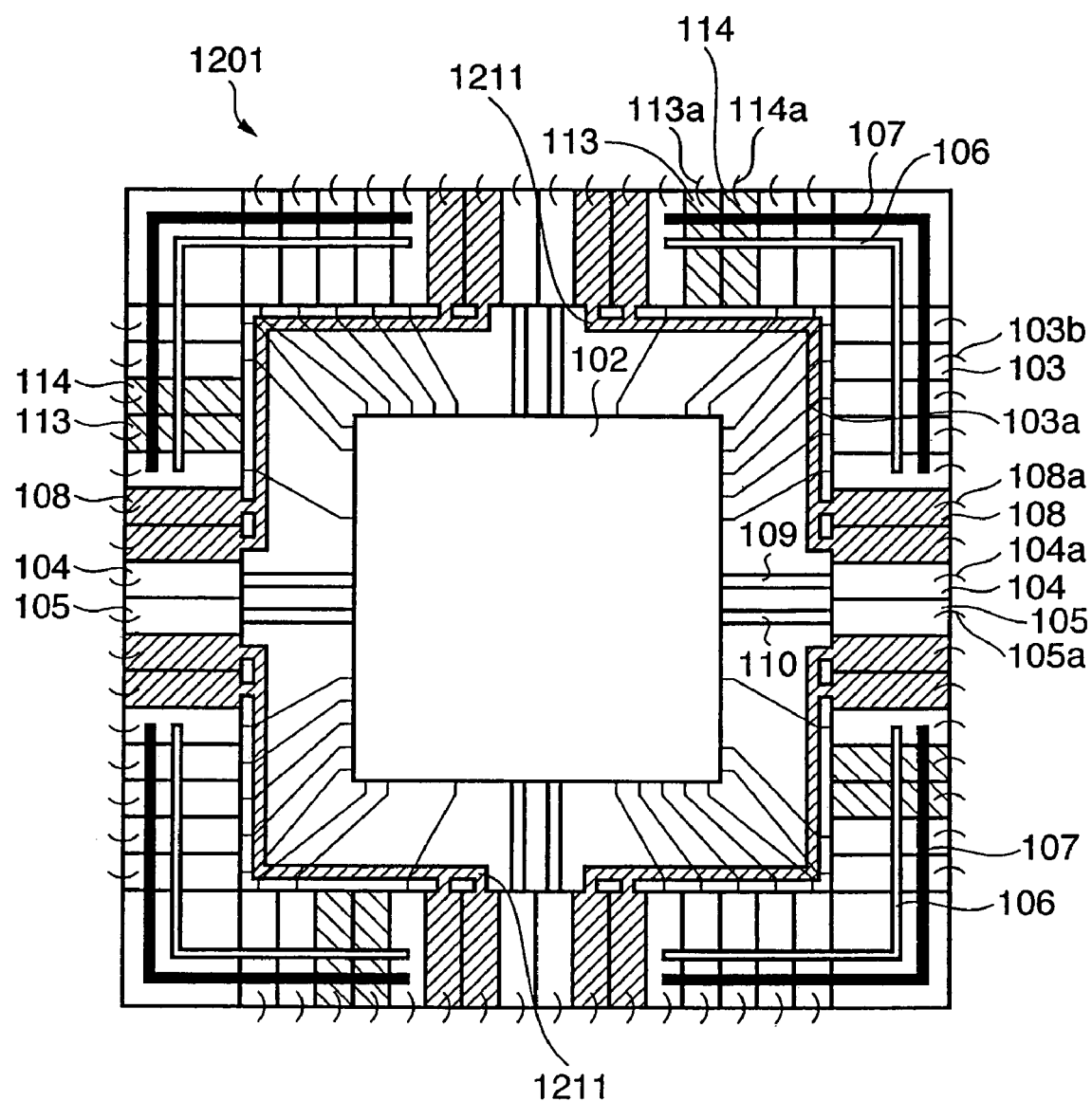
FIG. 15 is a view showing the schematic structure of a semiconductor device according to the third embodiment of the present invention.

FIG. 15 shows the third embodiment.

In this embodiment, the same input/output cells as in the first embodiment are used, and the semiconductor layout designer connects noise control cells 108 by wiring 1211. The wiring 1211 is connected to the semiconductor substrate. The semiconductor device designer connects the wiring 1211 to the semiconductor substrate arbitrarily by using wiring, vias, $p^+$-, or $n^+$-regions, as shown in FIG. 8, 9, 10, or 11.

As in the second embodiment, the noise absorption effect of the first embodiment can be increased. According to this embodiment, the noise control cells 108 are arbitrarily connected by the wiring 1211 only at a portion where noise propagation should be prevented. Hence, the area utilization ratio of the semiconductor device can be increased as compared to the structure of the second embodiment in which the noise control cells are always connected.

As described above, according to the above-described embodiment, the noise current generated in the power supply wiring and ground wiring by the internal circuit operation propagates to the internal circuit power supply cell and ground input/output cell and is then injected to the p-type semiconductor substrate. Then, the noise current is absorbed by the noise control cells arranged on both sides of the internal circuit power supply cell and ground cell. For this reason, the phenomenon that power supply noise and ground noise of the internal circuit are superimposed on the signal of the input/output circuit can be suppressed, radiation noise can be suppressed, and the radiation noise control cost (control components and control period) such as a printed circuit board outside the semiconductor integrated circuit can be reduced.

The phenomenon that power supply noise and ground noise of the internal circuit are superimposed on the signal of the input/output circuit can be suppressed, and radiation noise can be suppressed. In addition, power supply noise and ground noise generated in the input/output circuits, which are represented by simultaneous switching noise of the signal input/output circuits, are also absorbed by the ring wiring having connection portion of the p-type semiconductor substrate independently of the power supply ring wiring and ground ring wiring of the internal circuit and input/output circuits and the noise control cells arranged on both sides of the internal circuit power supply cell and ground cell. For this reason, any operation error of the internal circuit caused by the signal input/output circuit operation can be prevented.

In addition, noise control can be realized without changing the semiconductor layout method or increasing the number of semiconductor layout steps.

When wiring having connection portions to the semiconductor substrate is arbitrarily laid out only at necessary portions independently of the input/output circuit power supply wiring and ground ring wiring, any increase in area of the semiconductor device can be prevented.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application Nos. 2004-364775 filed on Dec. 16, 2004 and 2005-347939 filed on Dec. 1, 2005, which are hereby incorporated by reference herein.

What is claimed is:

1. A semiconductor device having an input/output circuit region and an internal circuit region, comprising:
   an internal circuit power supply cell which is arranged in the input/output circuit region and supplies a power to the internal circuit region;
   an internal circuit ground cell which is arranged in the input/output circuit region and supplies ground to the internal circuit region; and noise control cells which are formed from a p-type semiconductor substrate and are arranged to sandwich the internal circuit power supply cell and the internal circuit ground cell in the input/output circuit region and formed by electrically connecting the p-type semiconductor substrate to ground independently of the input/output circuit region and the internal circuit region.

2. The device according to claim 1, further comprising ground ring wiring which electrically connects said noise control cells.

3. The device according to claim 2, wherein said ground ring wiring is formed in an input/output cell arranged in the input/output circuit region.

4. The device according to claim 2, wherein said ground ring wiring is arranged outside the input/output circuit region.

5. A semiconductor device having an input/output circuit region and an internal circuit region, comprising:

an internal circuit power supply cell which is arranged in the input/output circuit region and supplies a power to the internal circuit region;

an internal circuit ground cell which is arranged in the input/output circuit region and supplies ground to the internal circuit region; and noise control cells which are formed from an n-type semiconductor substrate and are arranged to sandwich the internal circuit power supply cell and the internal circuit ground cell in the input/output circuit region and formed by electrically connecting the n-type semiconductor substrate to a power supply independently of the input/output circuit region and the internal circuit region.

6. The device according to claim 5, further comprising ground ring wiring which electrically connects said noise control cells.

7. The device according to claim 6, wherein said ground ring wiring is formed in an input/output cell arranged in the input/output circuit region.

8. The device according to claim 6, wherein said ground ring wiring is arranged outside the input/output circuit region.

9. A semiconductor device having an input/output circuit region and an internal circuit region, comprising:

an input/output circuit arranged in the input/output circuit region;

an internal circuit arranged in the internal circuit region;

an internal circuit power supply portion which is arranged in the input/output circuit region and supplies a power to the internal circuit;

an internal circuit ground portion which is arranged in the input/output circuit region and supplies ground to the internal circuit; and additional portions which are formed from a p-type semiconductor region and are arranged to sandwich the internal circuit power supply portion and the internal circuit ground portion in the input/output circuit region and electrically connecting the p-type semiconductor region to ground independently of the input/output circuit and the internal circuit.

10. A semiconductor device having an input/output circuit region and an internal circuit region, comprising:

an input/output circuit arranged in the input/output circuit region;

an internal circuit arranged in the internal circuit region;

an internal circuit power supply portion which is arranged in the input/output circuit region and supplies a power to the internal circuit;

an internal circuit ground portion which is arranged in the input/output circuit region and supplies ground to the internal circuit; and additional portions which are formed from an n-type semiconductor region and are arranged to sandwich the internal circuit power supply portion and the internal circuit ground portion in the input/output circuit region and formed by electrically connecting the n-type semiconductor region to a power supply independently of the input/output circuit and the internal circuit.

* * * * *